United States Patent
Kim et al.

(10) Patent No.: US 7,575,944 B2
(45) Date of Patent: Aug. 18, 2009

(54) METHOD OF MANUFACTURING NITRIDE-BASED SEMICONDUCTOR LIGHT EMITTING DIODE

(75) Inventors: Sun Woon Kim, Seoul (KR); Seong Ju Park, Gwangju (KR); Ja Yeon Kim, Jeollabuk-do (KR); Min Ki Kwon, Jeollabuk-do (KR); Dong Ju Lee, Suwon (KR); Jae Ho Han, Daejeon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 199 days.

(21) Appl. No.: 11/889,392

(22) Filed: Aug. 13, 2007

(65) Prior Publication Data

US 2008/0293177 A1 Nov. 27, 2008

(30) Foreign Application Priority Data

May 22, 2007 (KR) ...................... 10-2007-0049633

(51) Int. Cl.
*H01L 21/4763* (2006.01)
(52) U.S. Cl. .............................. 438/22; 438/24; 438/25; 438/27; 438/37; 438/46; 257/E21.478; 257/E29.143; 257/E33.004; 257/E33.008; 257/E33.073
(58) Field of Classification Search .................... 438/22, 438/24, 27, 37, 46, 52, 53, 54; 257/E21.478, 257/E23.023, E29.143, E33.004, E33.008, 257/E33.046, E33.073
See application file for complete search history.

(56) References Cited

U.S. PATENT DOCUMENTS 4,547,703 A * 10/1985 Fujita et al. ................. 313/509
4,914,490 A * 4/1990 Takasu et al. ................. 257/13
5,294,833 A * 3/1994 Schetzina .................... 257/741
5,794,839 A * 8/1998 Kimura et al. ........... 228/123.1
6,033,929 A * 3/2000 Murakami et al. ............ 438/46

(Continued)

FOREIGN PATENT DOCUMENTS

KR 10-2005-0064195 A 6/2005

(Continued)

OTHER PUBLICATIONS

Korean Notice of Allowance issued in Patent Application No. 10-2007-049633 dated on Jul. 28, 2008.

*Primary Examiner*—Michael S Lebentritt
(74) *Attorney, Agent, or Firm*—McDermott Will & Emery LLP

(57) ABSTRACT

Provided is a method of manufacturing a nitride-based semiconductor LED including sequentially forming an n-type nitride semiconductor layer, an active layer, and a p-type nitride semiconductor layer on a substrate; forming a Pd/Zn alloy layer on the p-type nitride semiconductor layer; heat-treating the p-type nitride semiconductor layer on which the Pd/Zn alloy layer is formed; removing the Pd/Zn alloy layer formed on the p-type nitride semiconductor layer; mesa-etching portions of the p-type nitride semiconductor layer, the active layer, and the n-type nitride semiconductor layer such that a portion of the upper surface of the n-type nitride semiconductor layer is exposed; and forming an n-electrode and a p-electrode on the exposed n-type nitride semiconductor layer and the p-type nitride semiconductor layer, respectively.

14 Claims, 3 Drawing Sheets

U.S. PATENT DOCUMENTS

| | | | |
|---|---|---|---|
| 6,416,888 B1 * | 7/2002 | Kawamura et al. | 428/690 |
| 6,794,061 B2 * | 9/2004 | Liao et al. | 428/690 |
| 6,952,025 B2 * | 10/2005 | Kamemura et al. | 257/98 |
| 6,954,034 B2 * | 10/2005 | Morishita | 315/169.3 |
| 7,393,600 B2 * | 7/2008 | Inoue et al. | 428/697 |
| 7,419,839 B2 * | 9/2008 | Camras et al. | 438/22 |
| 2002/0134986 A1 * | 9/2002 | Kamemura et al. | 257/98 |
| 2005/0003571 A1 * | 1/2005 | Kamiyama et al. | 438/46 |
| 2006/0102909 A1 | 5/2006 | Wu et al. | |
| 2007/0228395 A1 * | 10/2007 | Kamiyama et al. | 257/79 |
| 2008/0296609 A1 * | 12/2008 | Nagahama et al. | 257/103 |

FOREIGN PATENT DOCUMENTS

| | | |
|---|---|---|
| KR | 10-2005-0066029 A | 6/2005 |
| KR | 10-0586943 | 6/2005 |

* cited by examiner

[FIG. 1]
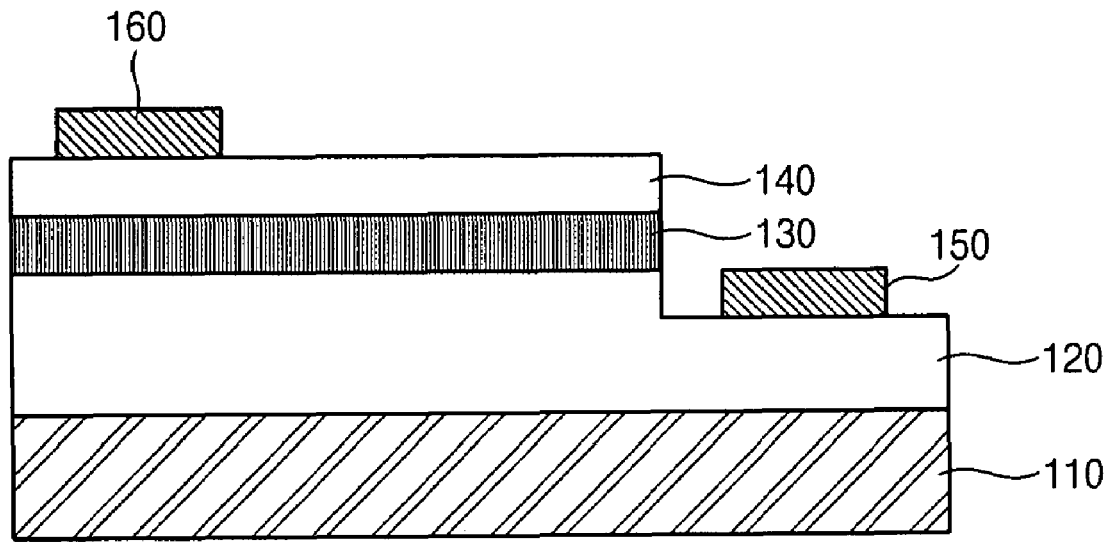
[FIG. 2]
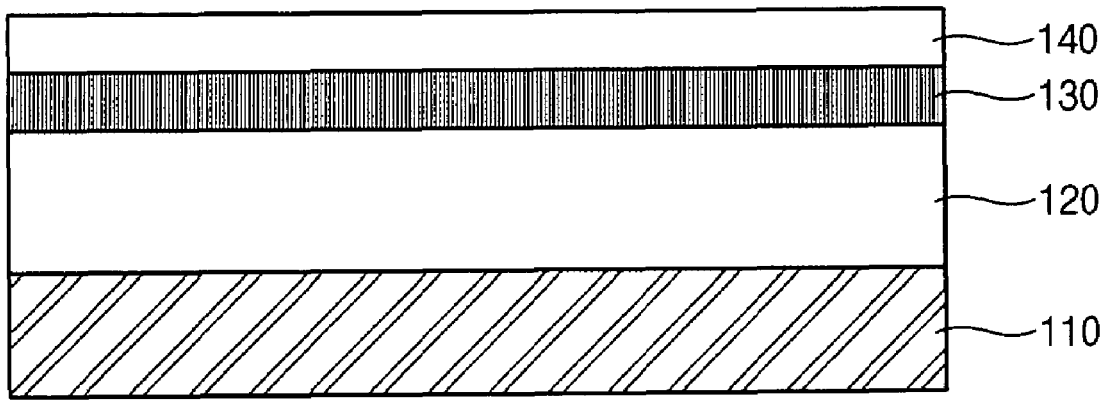
[FIG. 3]
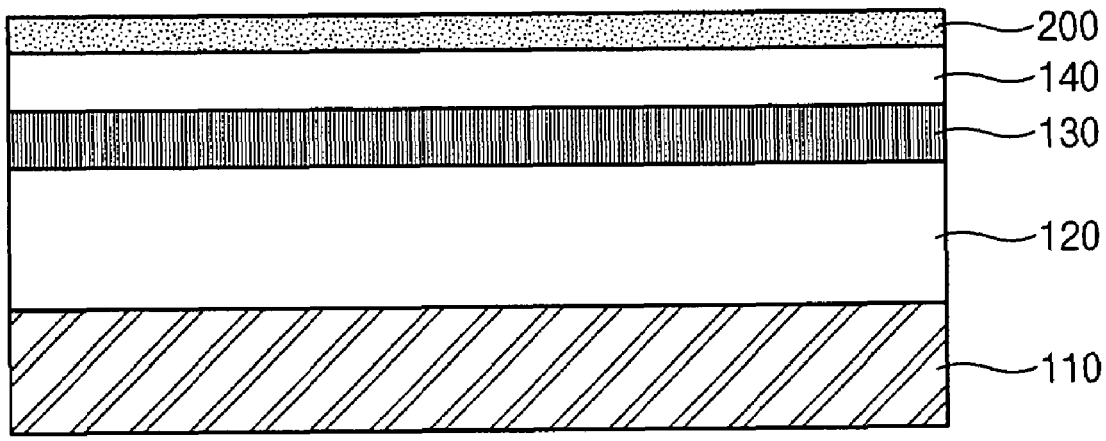

[FIG. 4]
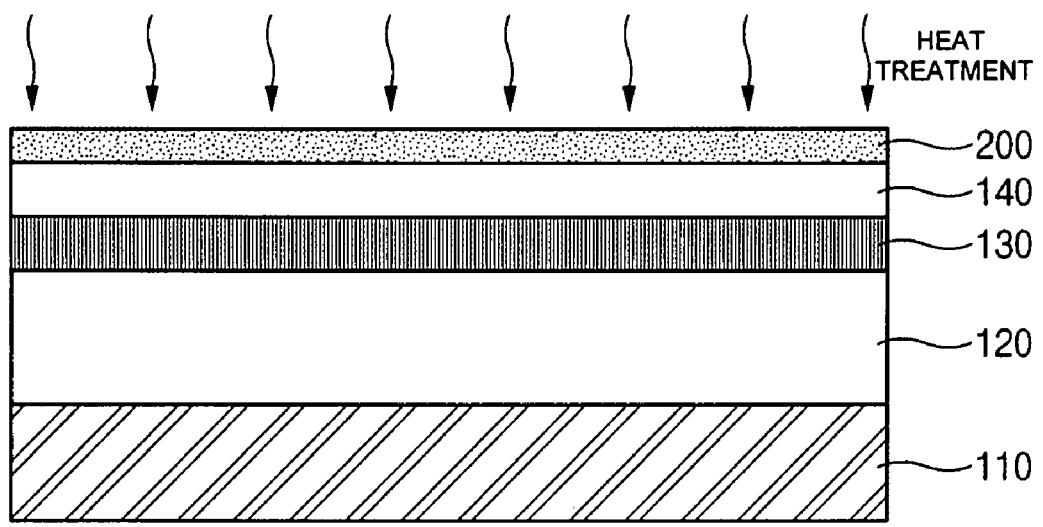
[FIG. 5]
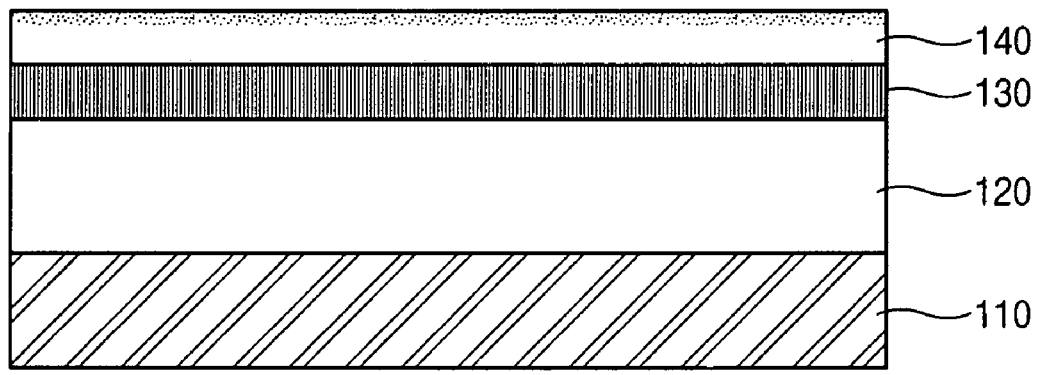
[FIG. 6]
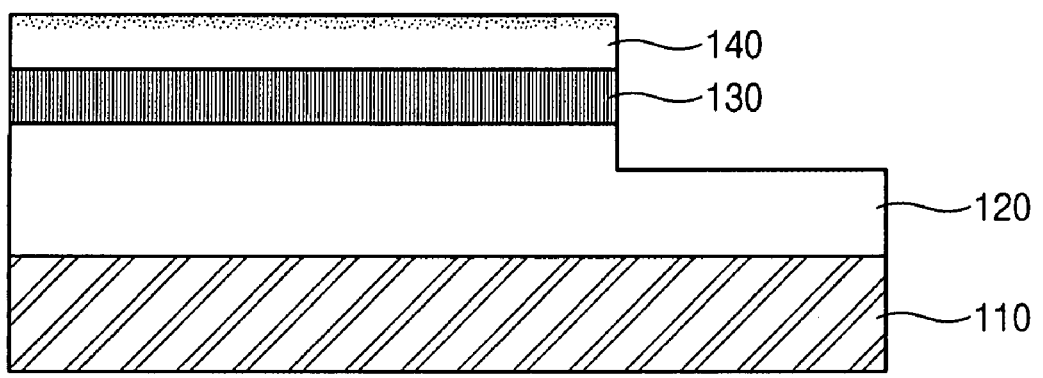

[FIG. 7]
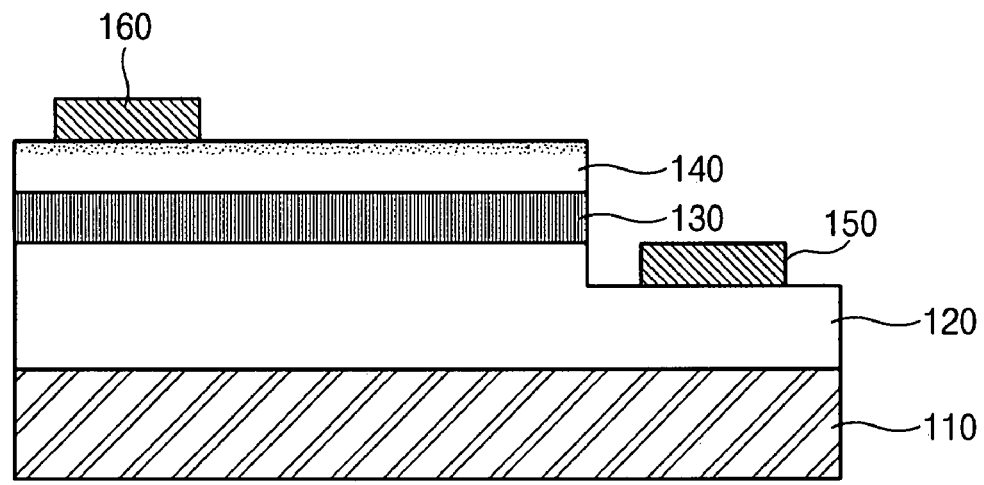
[FIG. 8]
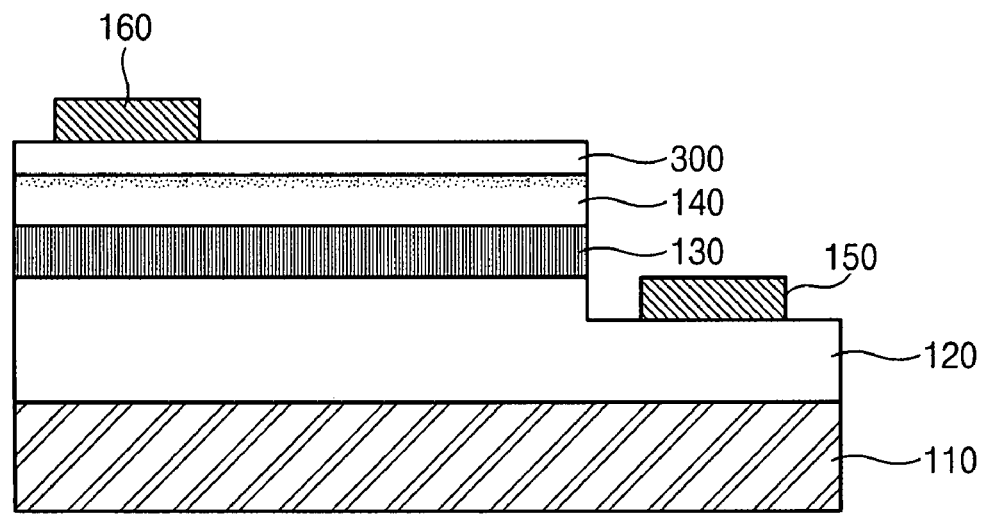
[FIG. 9]
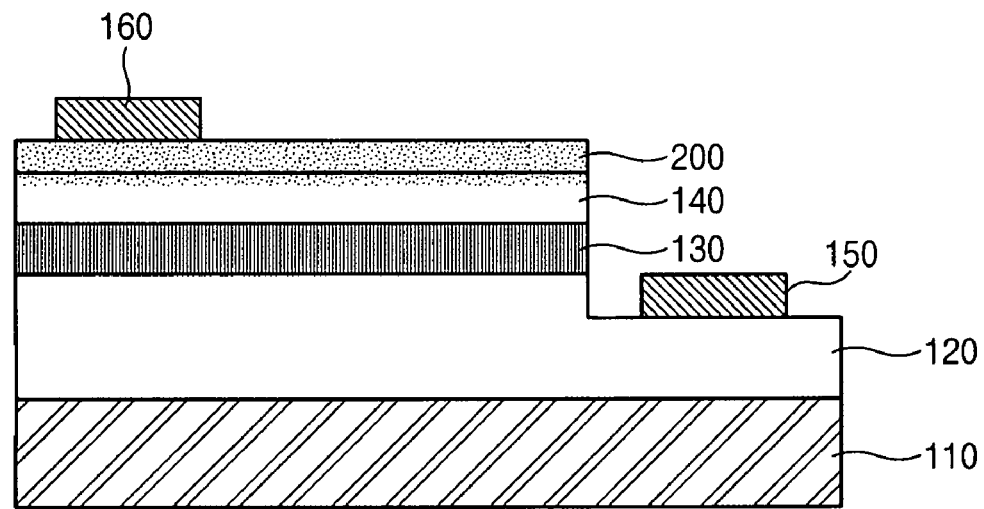

METHOD OF MANUFACTURING NITRIDE-BASED SEMICONDUCTOR LIGHT EMITTING DIODE

CROSS-REFERENCE TO RELATED APPLICATIONS

This application claims the benefit of Korean Patent Application No. 10-2007-0049633 filed with the Korean Intellectual Property Office on May 22, 2007, the disclosure of which is incorporated herein by reference.

BACKGROUND OF THE INVENTION

1. Field of the Invention

The present invention relates to a method of manufacturing a nitride-based semiconductor light emitting diode (LED), which can implement a low operation voltage and enhance internal quantum efficiency.

2. Description of the Related Art

In general, a nitride-based semiconductor is such a material that has a relatively high energy band gap (in the case of GaN semiconductor, about 3.4 eV), and is positively adopted in an optical device for generating green or blue short-wavelength light. As for the nitride semiconductor, a material having a compositional formula of $Al_xIn_yGa_{(1-x-y)}N$ (herein, $0 \leq x \leq 1$, $0 \leq y \leq 1$, and $0 \leq x+y \leq 1$) is widely used.

However, since such a nitride-based semiconductor has a relatively large energy band-gap, there are difficulties in forming the ohmic contact with an electrode. Particularly, since a p-type nitride semiconductor layer has a larger energy band-gap, contact resistance increases in the contact portion with a positive(p-) electrode. Such an increase causes an operational voltage of the device to increase, thereby increasing the heating value.

Therefore, there is a demand for a method which enhances electric conductivity of a nitride semiconductor layer of a nitride-based semiconductor LED to reduce an operation voltage and to improve an output, and increases internal quantum efficiency to increase light efficiency.

Now, referring to FIG. 1, a conventional nitride-based semiconductor LED will be described.

FIG. 1 is a cross-sectional view of a conventional nitride-based semiconductor LED.

As shown in FIG. 1, the conventional nitride-based semiconductor LED includes a sapphire substrate 110, a GaN buffer layer (not shown), an n-type nitride semiconductor layer 120, an active layer 130, and a p-type nitride semiconductor layer 140, which are sequentially grown on the substrate 10. Portions of the p-type nitride semiconductor layer 140 and the GaN/InGaN active layer 130 are removed by mesa-etching, so that a portion of the upper surface of the n-type nitride semiconductor layer 120 is exposed.

On the exposed n-type nitride semiconductor layer 120, a negative electrode (n-electrode) 150 is formed of Cr/Au. On the p-type nitride semiconductor layer 140, a positive electrode (p-electrode) 160 is formed of Cr/Au.

The n-type nitride semiconductor layer 120 and the p-type nitride semiconductor layer 140 have a large energy band-gap. Therefore, if the n-type nitride semiconductor layer 120 and the p-type nitride semiconductor layer 140 respectively come in contact with the n-electrode 160 and the p-electrode 160, the contact resistance increases. Such an increase causes an operational voltage of the diode to increase, thereby increasing the heating value.

To solve such a problem, when the n-type nitride semiconductor layer 120 and the p-type nitride semiconductor layer 140 are grown, an amount of doping element in the n-type nitride semiconductor layer 120 and the p-type nitride semiconductor layer 140 is increased, thereby enhancing electric conductivity of the n-type nitride semiconductor layer 120 and the p-type nitride semiconductor layer 140.

Meanwhile, a nitride semiconductor layer with high electric conductivity can be obtained when a ratio at which doping elements injected with high concentration are activated as donors or acceptors is high.

When the n-type nitride semiconductor layer 120 is grown, n-type Si elements serving as doping elements are used as dopants, and most of injected Si elements are activated so that electron concentration of more than $10^{18}$ cm$^{-3}$ can be implemented. However, when the p-type nitride semiconductor layer 140 is grown, p-type Mg elements serving as doping elements are used as dopants like the n-type nitride semiconductor layer 120, but a layer quality is bad and hole concentration is low because of the following three main factors. Therefore, it is difficult to implement a p-type nitride semiconductor layer with high concentration.

The first factor is the bonding of Mg and H within the p-type nitride semiconductor layer 140. More specifically, the p-type nitride semiconductor layer 140 according to the related art is grown by Metal Organic Chemical Vapor Deposition (MOCVD) using Hydrazine-based nitrogen precursor and nitrogen carrier gas. However, most of Mg injected as a doping element when the p-type nitride semiconductor layer 140 is grown is bonded to H and thus is not activated. Further, to solve the above-described problem, the bonding of Mg and H is broken through a heat-treatment process such that a ratio of Mg to be activated increases. However, the activation ratio is still low. Therefore, to reduce resistance of a nitride-based semiconductor LED, an excessive amount of Mg which is ten or hundred times larger than desired hole concentration should be injected when the p-type nitride semiconductor layer is grown. However, the GaN bonding of the p-type nitride semiconductor layer 140 has a different structure from the MgN bonding. Therefore, when an excessive amount of Mg is injected, the layer quality of the p-type nitride semiconductor layer 140 is significantly degraded.

The second factor is the growth temperature of the p-type nitride semiconductor layer 140. In the conventional nitride-based semiconductor LED, the n-type nitride semiconductor layer 120, the active layer 130, and the p-type nitride semiconductor layer 140 are sequentially formed on the substrate 110. Among them, the active layer 130 has a multi-quantum well structure including an InGaN layer. Since InN binding energy is weak, the InGaN layer is grown at a lower temperature by about 200° C. than a GaN layer. In this case, the p-type nitride semiconductor layer 140 is grown at a lower temperature than the n-type nitride semiconductor layer 120, in order to minimize a thermal damage of the active layer 130 which is grown at a relatively low temperature. However, as the growth temperature is low, a mobility of atoms at the grown surface is reduced. As a result, the atoms do not move to the stabilized surface because of short resident time, thereby further degrading a layer quality of the p-type nitride semiconductor layer 140.

The third factor is the generation of N (nitrogen) vacancy. When the p-type nitride semiconductor layer 140 is formed through the MOCVD, an N-vacancy defect when GaN is grown occur in many places, because a decomposition ratio of $NH_3$ gas serving as a supply source of N is extremely low. Since the N-vacancy defect is an n-type defect, an n-type nitride semiconductor is grown even when GaN is grown.

Therefore, since such an n-type defect occurs at the same time when the p-type nitride semiconductor layer 140 is grown, hole concentration is further reduced due to a compensation effect.

SUMMARY OF THE INVENTION

An advantage of the present invention is that it provides a method of manufacturing a nitride semiconductor LED, which can improve an activation process of a p-type nitride semiconductor layer to increase hole concentration within the p-type nitride semiconductor layer, reduce contact resistance to implement a low operation voltage, and enhance internal quantum efficiency.

Additional aspect and advantages of the present general inventive concept will be set forth in part in the description which follows and, in part, will be obvious from the description, or may be learned by practice of the general inventive concept.

According to an aspect of the invention, a method of manufacturing a nitride-based semiconductor LED comprises sequentially forming an n-type nitride semiconductor layer, an active layer, and a p-type nitride semiconductor layer on a substrate; forming a Pd/Zn alloy layer on the p-type nitride semiconductor layer; heat-treating the p-type nitride semiconductor layer on which the Pd/Zn alloy layer is formed; removing the Pd/Zn alloy layer formed on the p-type nitride semiconductor layer; mesa-etching portions of the p-type nitride semiconductor layer, the active layer, and the n-type nitride semiconductor layer such that a portion of the upper surface of the n-type nitride semiconductor layer is exposed; and forming an n-electrode and a p-electrode on the exposed n-type nitride semiconductor layer and the p-type nitride semiconductor layer, respectively.

Preferably, the Pd/Zn alloy layer is formed on the p-type nitride semiconductor layer excluding the region where the p-electrode is formed.

Preferably, the removing of the Pd/Zn alloy layer is performed in such a manner that the concentration of Pd and Zn remaining in the p-type nitride semiconductor layer is maintained at $1\times10^{16}$ to $1\times10^{20}$ cm$^{-3}$, through the heat-treating of the p-type nitride semiconductor layer. Further, Pd and Zn remaining in the p-type nitride semiconductor layer are positioned in the range of 2 to 100 nm from the upper surface of the p-type nitride semiconductor layer.

Preferably, the removing of the Pd/Zn alloy layer is performed in such a manner that the surface roughness of the p-type nitride semiconductor layer coming in contact with the Pd/Zn alloy layer is maintained at 0.5 to 10 nm.

Preferably, the method further comprises forming a transparent electrode layer on the p-type nitride semiconductor layer, after the removing of the Pd/Zn alloy layer. The transparent electrode layer is formed of a mixture obtained by adding one or more elements, selected from the group consisting of Sn, Zn, Mg, Cu, Ag, and Al, into indium oxide.

According to another aspect of the invention, a method of manufacturing a nitride-based semiconductor LED comprises sequentially forming an n-type nitride semiconductor layer, an active layer, and a p-type nitride semiconductor layer on a substrate; forming a Pd/Zn alloy layer on the p-type nitride semiconductor layer; heat-treating the p-type nitride semiconductor layer on which the Pd/Zn alloy layer is formed; mesa-etching portions of the Pd/Zn alloy layer, the p-type nitride semiconductor layer, the active layer, and the n-type nitride semiconductor layer such that a portion of the upper surface of the n-type nitride semiconductor layer is exposed; and forming an n-electrode and a p-electrode on the exposed n-type nitride semiconductor layer and the p-type nitride semiconductor layer, respectively.

Preferably, the heat-treating of the p-type nitride semiconductor layer is performed in such a manner that the concentration of Pd and Zn remaining in the p-type nitride semiconductor layer is maintained at $1\times10^{16}$ to $1\times10^{20}$ cm$^{-3}$. Further, Pd and Zn remaining in the p-type nitride semiconductor layer are positioned in the range of 2 to 100 nm from the upper surface of the p-type nitride semiconductor layer.

Preferably, the heat-treating of the p-type nitride semiconductor layer is performed in such a manner that the surface roughness of the p-type nitride semiconductor layer coming in contact with the Pd/Zn alloy layer is maintained at 0.5 to 10 nm.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a conventional nitride-based semiconductor LED;

FIGS. 2 to 7 are sectional views sequentially showing a process for explaining a method of manufacturing a nitride-based semiconductor LED according to a first embodiment of the invention;

FIG. 8 is a cross-sectional view of a modification of the nitride-based semiconductor LED manufactured according to the first embodiment; and FIG. 9 is a cross-sectional view of a nitride-based semiconductor LED manufactured according to a second embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, preferred embodiments of the present invention will be described in detail with reference to the accompanying drawings.

First Embodiment

FIGS. 2 to 7 are sectional views sequentially showing a process for explaining a method of manufacturing a nitride-based semiconductor LED according to a first embodiment of the invention.

First, as shown in FIG. 2, an n-type nitride semiconductor layer 120, a GaN/InGaN active layer 130 with a multi-quantum well structure, and a p-type nitride semiconductor layer 140 are sequentially laminated on a substrate 110, thereby forming a light emission structure.

Preferably, the substrate 110 is formed of a transparent material containing sapphire. In addition to sapphire, the substrate 100 may be formed of zinc oxide (ZnO), gallium nitride (GaN), silicon carbide (SiC), or aluminum nitride (AlN).

Although not shown, a GaN-based or SiC-based buffer layer for enhancing the lattice matching between the substrate 100 and the n-type nitride semiconductor layer 120 is further formed before the n-type nitride semiconductor layer 120 is formed on the substrate 110. The buffer layer can be omitted depending on a process condition and a diode characteristic.

The n-type and p-type nitride semiconductor layer 120 and 140 and the active layer 130 may be formed of a semiconductor material having a compositional formula of $Al_yIn_xGa_{(1-x-y)}N$ (here, $0 \leq x$, $0 \leq y$, and $x+y \leq 1$) and can be formed through a well-known nitride deposition process such as MOCVD. More specifically, the n-type nitride semiconductor layer 120 may be formed of a GaN layer or GaN/AlGaN layer doped with n-type conductive impurities. As for the n-type conductive impurities, Si, Ge, Sn and the like are used. The p-type nitride semiconductor layer 140 may be formed of a GaN layer or GaN/AlGaN layer doped with p-type conductive impurities. As for the p-type conductive e impurities, Mg, Zn, Be and the like are used.

Meanwhile, when the p-type nitride semiconductor layer 140 is formed by the MOCVD using H (hydrazine)-based nitrogen precursor and nitrogen carrier gas, most of Mg elements serving as doping elements are bonded to H and thus are not activated.

To solve the above-described problem, a ratio of Mg elements to be activated was increased by breaking the bonding of Mg and H through a heat-treatment process in the related art. However, since InN bonding energy is weak in the active layer 130 positioned under the p-type nitride semiconductor layer 140 and having a multi-quantum well structure including an InGaN layer, the InGaN layer is grown at a lower temperature by 200° C. than a GaN layer. Therefore, the heat-treatment process is performed at a lower temperature than the n-type nitride semiconductor layer 120, in order to minimize thermal damage of the active layer 130 grown at a relatively lower temperature. Accordingly, the activation ratio is still low. As such, if the bonding of Mg and H is not cut, an operational voltage increases, and light emission efficiency decreases.

In the invention, a Pd/Zn alloy layer 200 is formed on the p-type nitride semiconductor layer 140, as shown in FIG. 3, in order to effectively break the bonding of Mg and H at a low temperature. At this time, it is preferable that the Pd/Zn alloy layer 200 is formed on the p-type nitride semiconductor layer 140 excluding a region where a p-electrode is to be formed by a subsequent process.

Pd of the Pd/Zn alloy layer 200 has a property of adsorbing nitrogen having a volume 850 times larger than its volume. Pd having such a property serves as a catalyst in the process of breaking the bonding of Mg and H. Therefore, although the temperature of a heat-treatment process to be described below is reduced, the Mg activation process can be performed with high efficiency. Further, since Pd also serves as a refining catalyst ($CH_3 + H_2O = 3H_2 + CO_2$), an ohmic characteristic is enhanced by a $CO_2$ refinement effect.

In addition, since Zn of the Pd/Zn alloy layer 200 is an acceptor substance, Zn is substituted for H which is missed when the bonding of Mg and H is broken. Therefore, hole concentration can be enhanced by a co-doping effect of the bonding of Mg and Zn. The enhancement of hole concentration in the p-type nitride semiconductor layer 140 allows light emission efficiency to be improved through the reduction in operation voltage and the luminance enhancement.

Next, as shown in FIG. 4, the p-type nitride semiconductor layer 140 having the Pd/Zn alloy layer 200 formed thereon is heat-treated. Then, the bonding of Mg and H existing in the p-type nitride semiconductor layer 140 is effectively broken by Pd and Zn of the Pd/Zn alloy layer 200 serving as a catalyst and is then removed. Further, at the interface between the p-type nitride semiconductor layer 140 and the Pd/Zn alloy layer 200, Ga of the p-type nitride semiconductor layer is diffused with Pd and Zn, thereby improving contact resistance.

Then, as shown in FIG. 5, the Pd/Zn alloy layer 200 is etched using an acid solution as etching liquid. At this time, it is preferable that the process of removing the Pd/Zn alloy layer 200 formed on the p-type nitride semiconductor layer 140 is performed in such a manner that the concentration of Pd and Zn remaining in the p-type nitride semiconductor layer 140 is maintained at $1 \times 10^{16}$ to $1 \times 10^{20}$ cm$^{-3}$ through the process of heat-treating the p-type nitride semiconductor layer 140.

In addition, it is preferable that Pd and Zn remaining in the p-type nitride semiconductor layer 140 are positioned in the range of 2 to 100 nm from the upper surface of the p-type nitride semiconductor layer 140, and the surface roughness of the n-type nitride semiconductor layer 140 exposed by removing the Pd/Zn alloy layer 200 is maintained at 0.5 to 10 nm.

In other words, before the p-type nitride semiconductor layer 140 is heat-treated, the Pd/Zn alloy layer 200 is deposited on the p-type nitride semiconductor layer 140. Therefore, the bonding of Mg and H in the p-type nitride semiconductor layer 140 can be cut at a low temperature. This can be clarified through Table 1. That is, when the p-type nitride semiconductor layer is heat-treated without the Pd/Zn alloy layer, hole concentration of $1 \times 10^{17}$ cm$^{-3}$ can be obtained at a high temperature of 800° C. However, when the p-type nitride semiconductor layer is heat-treated with the Pd/Zn alloy layer, hole concentration of $2 \times 10^{17}$ cm$^{-3}$ can be obtained at a low temperature of 500° C.

TABLE 1

|  | Temperature | | | |
| --- | --- | --- | --- | --- |
|  | 500° C. | 600° C. | 700° C. | 800° C. |
| With Pd/Zn alloy layer | $2.04 \times 10^{17}$ cm$^{-3}$ | $3.02 \times 10^{17}$ cm$^{-3}$ | $1.00 \times 10^{17}$ cm$^{-3}$ | $1.20 \times 10^{17}$ cm$^{-3}$ |
| Without Pd/Zn alloy layer | $7.20 \times 10^{15}$ cm$^{-3}$ | $1.77 \times 10^{16}$ cm$^{-3}$ | $8.91 \times 10^{16}$ cm$^{-3}$ | $1.07 \times 10^{17}$ cm$^{-3}$ |

Next, as shown in FIG. 6, a mesa etching process is performed to remove portions of the p-type nitride semiconductor layer 140, the active layer 130, and the n-type nitride semiconductor layer 120 such that a portion of the n-type nitride semiconductor layer 120 is exposed.

Then, as shown in FIG. 7, an n-electrode 150 and a p-electrode 160 are formed on the exposed n-type nitride semiconductor layer 120 and the p-type nitride semiconductor layer 160, respectively.

Meanwhile, as shown in FIG. 8, a transparent electrode 300 for enhancing a current spreading effect may be further formed, before the p-electrode 150 is formed on the p-type nitride semiconductor layer 140. FIG. 8 is a cross-sectional view of a modification of the nitride-based semiconductor LED manufactured according to the first embodiment.

Second Embodiment

Referring to FIG. 9, a method of manufacturing a nitride-based semiconductor LED according to a second embodiment of the invention will be described. However, the descriptions of the same components as those of the first embodiment will be omitted.

FIG. 9 is a cross-sectional view of a nitride-based semiconductor LED manufactured according to a second embodiment of the invention.

As shown in FIG. 9, the nitride-based semiconductor LED manufactured according to the second embodiment has almost the same construction as that of the nitride-based semiconductor LED manufactured according to the first embodiment. However, the nitride-based semiconductor LED manufactured according to the second embodiment is different from the nitride-based semiconductor LED manufactured according to the first embodiment only in that the Pd/Zn alloy layer 200 at the interface between the p-type nitride semiconductor layer 140 and the p-electrode 160 is not removed but remains.

That is, in the first embodiment, the Pd/Zn alloy layer 200 is removed before the p-electrode is formed. In the second embodiment, however, the process of removing the Pd/Zn alloy layer 200 is omitted, and the Pd/Zn alloy layer 200 is used as an ohmic contact layer between the p-type nitride semiconductor layer 140 and the p-electrode 160.

The second embodiment has the same operation and effect as the first embodiment. Further, an ohmic characteristic which allows low contact resistance to be implemented can be obtained through the Pd/Zn alloy layer disposed between the p-type nitride semiconductor layer and the p-electrode.

According to the invention, the Pd/Zn alloy layer is provided on the p-type nitride semiconductor layer before the p-type nitride semiconductor layer is heat-treated. Therefore, the bonding of Mg and H existing in the p-type nitride semiconductor layer can be effectively broken at a low heat-treatment temperature by using the hydrogen-adsorption property of Pd.

Further, Zn of the Pd/Zn alloy layer is substituted for H which is missed when the bonding of Mg and H is broken, thereby enhancing hole concentration through the co-doping effect of the bonding of Mg and Zn.

Therefore, it is possible to provide a high-efficiency nitride-based semiconductor LED which can implement a low operation voltage and enhance internal quantum efficiency.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a nitride-based semiconductor light emitting diode (LED), the method comprising:
   sequentially forming an n-type nitride semiconductor layer, an active layer, and a p-type nitride semiconductor layer on a substrate;
   forming a Pd/Zn alloy layer on the p-type nitride semiconductor layer;
   heat-treating the p-type nitride semiconductor layer on which the Pd/Zn alloy layer is formed;
   removing the Pd/Zn alloy layer formed on the p-type nitride semiconductor layer;
   mesa-etching portions of the p-type nitride semiconductor layer, the active layer, and the n-type nitride semiconductor layer such that a portion of the upper surface of the n-type nitride semiconductor layer is exposed; and
   forming an n-electrode and a p-electrode on the exposed n-type nitride semiconductor layer and the p-type nitride semiconductor layer, respectively.

2. The method according to claim 1,
   wherein the Pd/Zn alloy layer is formed on the p-type nitride semiconductor layer excluding the region where the p-electrode is formed.

3. The method according to claim 1,
   wherein the removing of the Pd/Zn alloy layer is performed in such a manner that the concentration of Pd and Zn remaining in the p-type nitride semiconductor layer is maintained at $1 \times 10^{16}$ to $1 \times 10^{20}$ cm$^{-3}$, through the heat-treating of the p-type nitride semiconductor layer.

4. The method according to claim 3,
   wherein Pd and Zn remaining in the p-type nitride semiconductor layer are positioned in the range of 2 to 100 nm from the upper surface of the p-type nitride semiconductor layer.

5. The method according to claim 1,
   wherein the removing of the Pd/Zn alloy layer is performed in such a manner that the surface roughness of the p-type nitride semiconductor layer coming in contact with the Pd/Zn alloy layer is maintained at 0.5 to 10 nm.

6. The method according to claim 1 further comprising:
   forming a transparent electrode layer on the p-type nitride semiconductor layer, after the removing of the Pd/Zn alloy layer.

7. The method according to claim 6,
   wherein the transparent electrode layer is formed of a mixture obtained by adding one or more elements, selected from the group consisting of Sn, Zn, Mg, Cu, Ag, and Al, into indium oxide.

8. A method of manufacturing a nitride-based semiconductor LED, the method comprising:
   sequentially forming an n-type nitride semiconductor layer, an active layer, and a p-type nitride semiconductor layer on a substrate;
   forming a Pd/Zn alloy layer on the p-type nitride semiconductor layer;
   heat-treating the p-type nitride semiconductor layer on which the Pd/Zn alloy layer is formed;
   mesa-etching portions of the Pd/Zn alloy layer, the p-type nitride semiconductor layer, the active layer, and the n-type nitride semiconductor layer such that a portion of the upper surface of the n-type nitride semiconductor layer is exposed; and
   forming an n-electrode and a p-electrode on the exposed n-type nitride semiconductor layer and the p-type nitride semiconductor layer, respectively.

9. The method according to claim 8,
   wherein the Pd/Zn alloy layer is formed on the p-type nitride semiconductor layer excluding the region where the p-electrode is formed.

10. The method according to claim 8,
   wherein the heat-treating of the p-type nitride semiconductor layer is performed in such a manner that the concentration of Pd and Zn remaining in the p-type nitride semiconductor layer is maintained at $1\times10^{16}$ to $1\times10^{20}$ cm$^{-3}$.

11. The method according to claim 10,
wherein Pd and Zn remaining in the p-type nitride semiconductor layer are positioned in the range of 2 to 100 nm from the upper surface of the p-type nitride semiconductor layer.

12. The method according to claim 8,
wherein the heat-treating of the p-type nitride semiconductor layer is performed in such a manner that the surface roughness of the p-type nitride semiconductor layer coming in contact with the Pd/Zn alloy layer is maintained at 0.5 to 10 nm.

13. The method according to claim 8 further comprising:
forming a transparent electrode layer on the p-type nitride semiconductor layer, before the forming of the n-electrode and the p-electrode.

14. The method according to claim 13,
wherein the transparent electrode layer is formed of a mixture obtained by adding one or more elements, selected from the group consisting of Sn, Zn, Mg, Cu, Ag, and Al, into indium oxide.

* * * * *